United States Patent [19]
Kersch et al.

[11] Patent Number: 5,998,767
[45] Date of Patent: Dec. 7, 1999

[54] APPARATUS FOR PROCESSING A SUBSTRATE WAFER AND METHOD FOR OPERATING SAME

[75] Inventors: Alfred Kersch, Munich; Thomas Schafbauer, Ottobrunn, both of Germany

[73] Assignee: Siemens Aktiengesellschaft, Munich, Germany

[21] Appl. No.: 09/045,512

[22] Filed: Mar. 20, 1998

[30] Foreign Application Priority Data

Mar. 20, 1997 [DE] Germany ............................ 197 11 702

[51] Int. Cl.$^6$ ........................................................ G01J 5/02
[52] U.S. Cl. ........................... 219/390; 392/418; 118/728; 374/133; 374/121; 374/181
[58] Field of Search ........................ 219/390, 405, 219/411; 392/416, 418; 118/724, 725, 728, 50.1; 374/121, 133, 134, 179, 181, 182

[56] References Cited

U.S. PATENT DOCUMENTS

| | | |
|---|---|---|
| 5,059,770 | 10/1991 | Mahawili ................................ 219/390 |
| 5,106,200 | 4/1992 | Hosokawa ................................ 374/121 |
| 5,356,486 | 10/1994 | Sugarman et al. . |
| 5,374,315 | 12/1994 | deBoer et al. ............................ 118/725 |
| 5,539,855 | 7/1996 | Takahashi et al. . |
| 5,551,985 | 9/1996 | Brors et al. ............................... 118/725 |
| 5,624,590 | 4/1997 | Fiory ........................................ 219/390 |
| 5,685,906 | 11/1997 | Dietze et al. ............................ 118/725 |
| 5,716,133 | 2/1998 | Hosokawa et al. ...................... 374/121 |
| 5,753,891 | 5/1998 | Iwata et al. .............................. 219/390 |
| 5,831,249 | 11/1998 | Rohner et al. ........................... 219/390 |

FOREIGN PATENT DOCUMENTS 1-297795  11/1989  Japan .

OTHER PUBLICATIONS

Solid State Technology, "Temperature control slows RTP's advance", Dec. 1996, pp. 34 and 36.

*Primary Examiner*—Joseph Pelham
*Attorney, Agent, or Firm*—Hill & Simpson

[57] ABSTRACT

An apparatus for processing a substrate wafer wherein the apparatus includes a reaction chamber, a wafer holder intended to hold the substrate wafer, and a susceptor. A temperature sensor, preferably a thermocouple with two junctions, is provided for measuring the difference between the temperatures at the site of the susceptor and at a site between the susceptor and the substrate wafer.

10 Claims, 1 Drawing Sheet

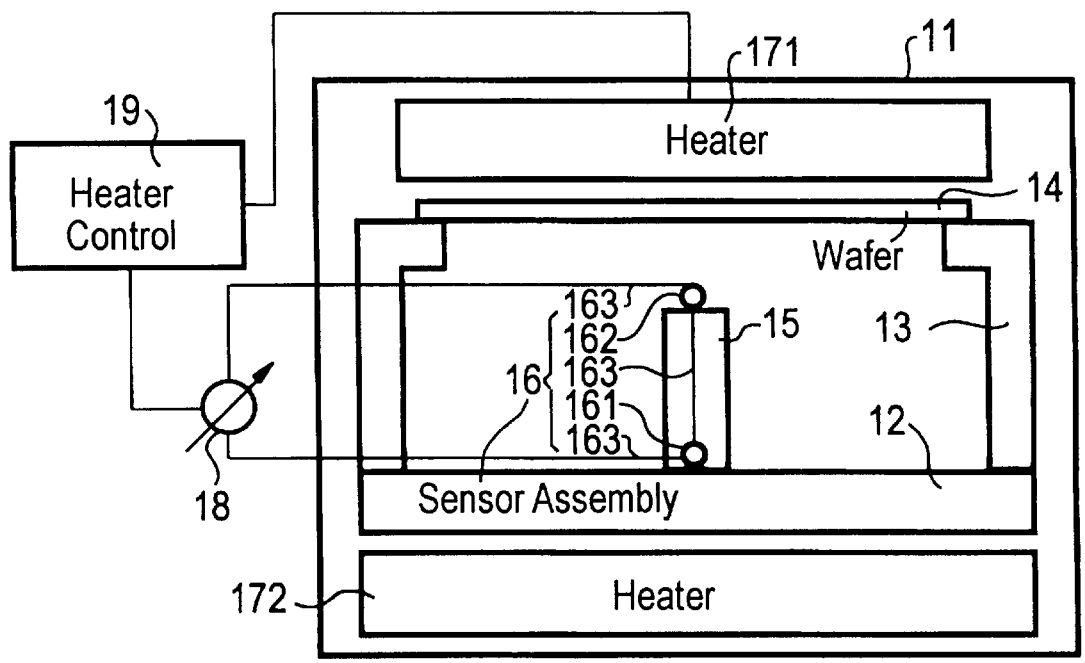
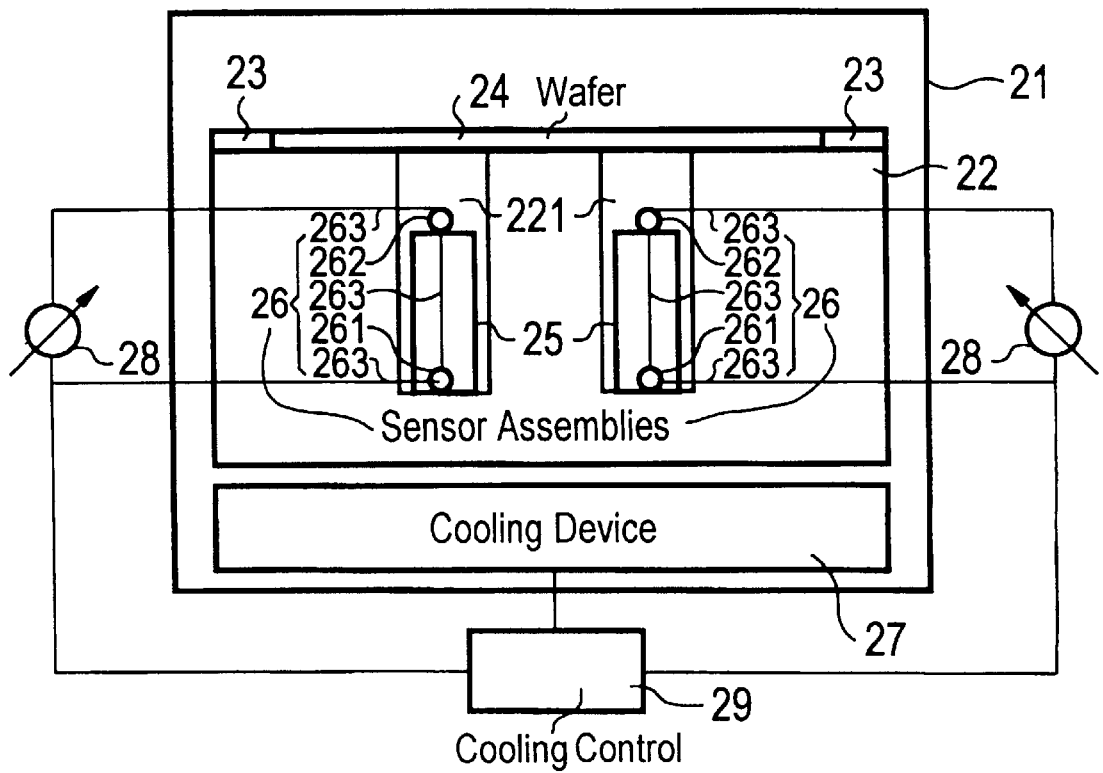

APPARATUS FOR PROCESSING A SUBSTRATE WAFER AND METHOD FOR OPERATING SAME

BACKGROUND OF THE INVENTION

1. Field of the Invention

The present invention is directed to an apparatus for processing a substrate wafer and, more particularly, to an apparatus for processing a substrate wafer wherein a temperature sensor having two sensor elements is provided for measuring the difference between the temperatures at the site of a susceptor and at a site between the susceptor and the substrate wafer itself.

2. Description of the Prior Art

In many semiconductor fabrication processes, it is important for the temperature of a substrate wafer being processed to be measured and/or regulated with an accuracy of better than one percent. This technical problem also arises outside of semiconductor fabrication in the processing of other substrate wafers; for example, during heat-treatment and/or the application of thin layers to glass or plastic substrate wafers.

In semiconductor fabrication, the temperatures in question are often greatly in excess of 1000° C. The problem arises both in so-called RTP reactors in which the temperature is varied rapidly at 50° C. per second and in reactors where the temperature is varied only slowly wherein the substrate wafer is in thermal equilibrium with its surroundings.

Various methods have been proposed for measuring the temperature of a substrate wafer being processed (see, for example, Solid State Technology, December 1996, pages 34 to 36). In optical methods, the intensity of radiation from or through the substrate wafer is measured. The accuracy of these methods is limited by the fact that the radiation intensity emitted or transmitted depends on the optical properties of the substrate wafer. These properties differ greatly from one substrate wafer to another, and expensive calibration methods are therefore necessary. Furthermore, the optical properties can change during the processing operation; for example, during the deposition of a layer.

It has also been proposed to provide a susceptor in the reactor. A susceptor is a body which is arranged next to the substrate wafer. The mass of the susceptor depends on the thermal requirements of the application. In RTP reactors, where it is necessary for the temperature to be varied rapidly, the susceptor has a low mass and therefore generally a small thickness. In epitaxy reactors or layer deposition reactors, where it is necessary to have a uniform temperature, susceptors generally have a high mass and therefore large thicknesses. The terms hot plate, hot liner and heat shield, or just shield, are common alternatives to the term susceptor in this field. In order to measure the temperature of a substrate wafer, the temperature of the susceptor is measured. It is assumed that the temperature of the susceptor is substantially equal to the temperature of the substrate wafer. However, although the measurement of the temperature of the susceptor, with optical methods or using a thermocouple, is very accurate, the assumption that the temperature of the substrate wafer is equal to the temperature of the susceptor is, at the very least, not very reliable.

Lastly, acoustic methods have also been proposed. So far however, these have not been found to be satisfactory in terms of either their accuracy or their reproducibility.

SUMMARY OF THE INVENTION

An object of the present invention is to provide an apparatus for processing a substrate wafer wherein means are provided for measuring the temperature of the substrate wafer with increased accuracy. A further object is to provide a method for operating an apparatus of this type.

In accordance with the teachings of the present invention, an apparatus for processing a substrate wafer can be used both in semiconductor fabrication and for the deposition of thin layers on glass or plastic substrates. In semiconductor fabrication, the apparatus may, in particular, be produced in the form of an RTP reactor, epitaxy reactor, CVD reactor, dry etching reactor, or plasma-enhanced CVD reactor.

The apparatus includes a reaction chamber in which a wafer holder, intended to hold the substrate wafer, and a susceptor are provided. A temperature sensor is also provided which is suitable for measuring a temperature difference between the temperature at the site of the susceptor and the temperature at a site between the susceptor and the wafer holder. To this end, the temperature sensor has at least two sensor elements—one of which is arranged on the susceptor and the other of which is arranged at the site between the susceptor and the wafer holder.

In order to determine the temperature of the substrate wafer, the present invention provides for the difference in temperature between the susceptor and a site between the susceptor and the substrate wafer to be measured in the apparatus. Independently of this, a measurement is taken of the susceptor temperature which can be measured with high accuracy. On the basis of the temperature of the susceptor and the temperature difference, a calibration curve may be used to determine the temperature of the substrate wafer itself.

Since it is only the temperature difference which the temperature sensor measures, and this difference is much less than the temperature of the susceptor, an increased accuracy is achieved in terms of the temperature of the substrate wafer. If the temperature of the susceptor is 1000° C., and the temperature difference is a few degrees Celsius, then even if the measuring error for the temperature sensor is in the region of 10 percent, an accuracy of better than 1 percent is achieved for the temperature of the substrate wafer.

Examples of suitable susceptors are bodies made of graphite, semiconductor, glass, ceramic or metal which have a surface area comparable with that of the substrate wafer; for example, between $(1\ cm)^2$ and $(1\ m)^2$ and whose thickness is between 0.1 mm and a few cm.

Preferably, a thermocouple having two junctions is used as the temperature sensor wherein the junctions represent the sensor elements. One of the junctions is arranged on the surface of the susceptor and the other junction is arranged between the susceptor and the substrate wafer. The thermocouple delivers a voltage which is proportional to the measured temperature difference.

Preferably, a frame made of thermal insulating material, such as glass or ceramic, is arranged on the surface of the susceptor in order to hold the thermocouple. One of the junctions is arranged, for example, at the base of the retaining device and the other junction is fastened on the opposite side. This procedure fixes the geometry. At the same time, the frame avoids thermal contact between the susceptor and the junction arranged between the susceptor and the substrate wafer. A frame of this type may, for example, be produced in the form of a hollow ceramic cylinder.

The present invention provides for the susceptor to be connected to the wafer holder. In this case, the distance between the susceptor and the substrate wafer is very small. In this embodiment, the susceptor has an indentation which is on the side facing the wafer holder and in which the sensor elements are arranged. It is, in this case, advantageous to keep the dimensions of the indentation as small as possible in order to keep the temperature distribution in the susceptor homogenous.

The apparatus preferably has both a first heating device and a second heating device which can be driven independently of one another. Examples of a suitable heating device include a lamp heater and a resistive heater. The first heating device is intended to heat the substrate wafer while the second heating device is intended to heat the susceptor. Furthermore, the apparatus has a control unit wherein the first heating device can be controlled as a function of the temperature difference measured by the temperature sensor. The first heating device is preferably controlled in such a way so as to make the temperature difference zero. The temperature of the substrate wafer will then be equal to the temperature of the susceptor.

According to a further embodiment of the present invention, a cooling device is provided which is thermally connected to the wafer holder. Suitable cooling devices include, for example, means for flushing with helium between the susceptor and the substrate wafer, a susceptor cooler, or means for applying pressure using a mechanical or electrostatic force. A control unit is provided by which the cooling device can be controlled. This arrangement is particularly advantageous for those reactors where the substrate wafer becomes heated as a result of the processing. Such is the case, for example, with plasma-enhanced processes. In this arrangement, the temperature at the substrate wafer is monitored by measuring the temperature difference so that the cooling device can be controlled in accordance with the temperature of the substrate wafer.

Additional features and advantages of the present invention are described in, and will be apparent from, the detailed description of the presently preferred embodiments and from the drawings.

DESCRIPTION OF THE DRAWINGS

FIG. 1 schematically shows an apparatus of the present invention for processing a substrate wafer wherein the apparatus includes two heating devices that can be controlled independently of one another and a control unit.

FIG. 2 schematically shows an apparatus of the present invention for processing a substrate wafer wherein the apparatus includes a cooling device.

DETAILED DESCRIPTION OF THE PREFERRED EMBODIMENTS

Turning to FIG. 1, a susceptor 12, made of graphite or SiC or Si, and a wafer holder 13 are arranged in a reaction chamber 11. The susceptor 12 is, for example, in the form of a disc and has a thickness of 1 mm and a diameter of a few tens of cm. The wafer holder 13 consists of quartz glass, for example, and is mechanically connected to the susceptor 12.

There is a substrate wafer 14 on the wafer holder 13. The substrate wafer 14 has for example, a diameter of a few tens of cm and a thickness of 1 mm. The substrate wafer 14 is, for example, a monocrystalline silicon wafer, an SO1 wafer, a glass wafer or a plastic wafer. The distance between the substrate wafer 14 and the susceptor is, for example, 10 mm.

A frame 15 made of thermally insulating material is arranged on the surface of the susceptor 12. The frame 15 may, for example, be a ceramic cylinder having as height of 8 mm and a diameter of 1 mm and a wall thickness of 0.2 mm.

A thermocouple 16, having a first junction 161, a second junction 162 and wires 163, is arranged in the reaction chamber 11 and is preferably made of platinum rhodium. The first junction 161 is arranged at the bottom of the frame 15 on the surface of the susceptor 12. The second junction 162 is fastened on the opposite side of the frame 15, for example, in a narrowed part of the cylinder. The wires 163 which form the terminals of the thermocouple are fed out of the reaction chamber 11 via feed-throughs (not represented in detail). The diameter of the wires 163 is, for example, 0.1 mm.

A first heating device 171 and a second heating device 172 (lamp heaters, for example) are provided in the reaction chamber 11 and may be driven independently of one another. The first heating device 171 is used to heat the substrate wafer 14 while the second heating device 172 is used to heat the susceptor 12.

Wires 163 forming the terminals of the thermocouple 16 are connected to a measuring instrument 18. The voltage drop across the measuring instrument 18 is a signal dependent on the difference in temperature between the first junction 161 and the second junction 162. This voltage signal is fed to an input of a control unit 19. The control unit 19 is connected to the first heating device 171. The control unit 19 controls the first heating device 171 in such a way so as to make the voltage signal, which is proportional to the temperature difference measured by the thermocouple 16, zero. In this case, use is made of the knowledge that, if the susceptor 12 and the substrate wafer 14 are at the same temperature, any point between the susceptor 12 and the substrate wafer 14 is also at this temperature. Consequently, a second junction 162 can be arranged at any point between the susceptor 12 and the substrate wafer 14.

In order to determine the absolute temperature of the substrate wafer 14, the temperature of the susceptor 12 is measured in a known fashion. The described control method ensures that the temperature of the substrate wafer 14 is equal to the temperature of the susceptor 12.

In a further illustrative embodiment, an apparatus for processing a substrate wafer includes a reaction chamber 21 in which a susceptor 22 and a wafer holder 23 are arranged (see FIG. 2). The wafer holder 23 is securely connected to the susceptor 22 wherein it forms an extension to the edge of the susceptor 22. As such, a substrate wafer 24 rests substantially on the susceptor 22. The susceptor 22 is made, for example, of SiC-coated graphite. It has a substantially cylindrical shape with, for example, a diameter of a few tens of cm and a thickness of a few cm.

Indentations 221 are arranged in a base surface of the susceptor 22. The indentations 221 adjoin the susceptor 22 base surface on which the substrate wafer 24 rests. The indentations 221 have, for example, a radius of 1.8 mm and a depth of 4.5 mm.

A frame 25 is arranged in each of the indentations 221. This frame 25 is preferably made of a ceramic cylinder and has for example, a diameter of 1 mm, a wall thickness of 0.2 mm and a height of 4.3 mm.

Each ceramic cylinder represents a frame for one of the thermocouples 26 which is preferably made of platinum/rhodium. Each of the thermocouples 26 includes a first junction 261, a second junction 262 and wires 263. The diameter of the wires 263 is, for example, 0.1 mm. The first junction 261 is, in this case, arranged at the bottom of the indentation 221, on the surface of the susceptor 22. The second junction 262 is fastened on the opposite side of the frame 25. Two of the wires 263 serve as terminals of the thermocouple and are connected to a measuring instrument 28 via feed-throughs (not shown). A voltage signal proportional to the difference in temperature at the site of the first junction 261 and the second junction 262 is produced in the measuring instrument 28.

A cooling device 27 is furthermore arranged in the reaction chamber 21. The cooling device 27 is thermally connected to the susceptor 22 and the substrate wafer 24 resting inside the wafer holder 23 on the surface of the susceptor 22. The cooling device 27 consists, for example, of a plate which is itself cooled. As an alternative, the cooling device is produced by flushing helium between the susceptor and the substrate wafer 24, or by applying pressure to the substrate wafer using a mechanical or electrical force.

A control device 29 is provided which controls the cooling device 27 as a function of the temperature differences measured by the measuring instruments 28. In many processes, it is advantageous to provide control such that the temperature difference does not exceed a predetermined value. In particular, in the case of plasma-enhanced processes, unacceptable heating of the substrate wafer 24 by ion bombardment may be avoided.

The present invention is not restricted to the two illustrative embodiments which have been described. Indeed, it is possible for a susceptor of similar design to FIG. 2 to be used in the illustrative embodiment described with reference to FIG. 1. Furthermore, it is possible to use heating devices which cannot be controlled independently of one another. The control method is, in this case, superfluous. The measuring instrument 18 then measures a temperature difference from which, together with the temperature of the susceptor, the temperature of the substrate wafer 14 can be determined using a calibration curve. Furthermore, a cooling device may be provided instead of the heating device in the illustrative embodiment explained with reference to FIG. 1.

It is also possible to have similar variants in the illustrative embodiment explained with reference to FIG. 2; in particular, the use of independently controllable heating devices and a control method, as explained with reference to FIG. 1, or the use of a susceptor similar to the one described with reference to FIG. 1, or the provision of only one indentation, if temperature inhomogeneities over the surface of the substrate wafer 24 are of no importance. In addition, the control method may be omitted altogether.

Although the present invention has been described with reference to specific embodiments, those skilled in the art will indeed recognize that changes may be made thereto without departing from the spirit and scope of the invention as set forth in the hereafter appended claims.

We claim as our invention:

1. An apparatus for processing a substrate wafer, comprising:
   a reaction chamber;
   a wafer holder for holding a substrate wafer provided in the reaction chamber;
   a susceptor provided in the reaction chamber; and
   a temperature sensor having first and second sensor elements, the first sensor element arranged on the susceptor and the second sensor element arranged at a location between the susceptor and the substrate wafer, wherein the temperature sensor measures a temperature difference between a first temperature at the susceptor and a second temperature at the location between the susceptor and the substrate wafer.

2. An apparatus as claimed in claim 1, wherein a thermocouple having two junctions is used as the temperature sensor, the two junctions serving as the first and second sensor elements.

3. An apparatus as claimed in claim 2, further comprising:
   a thermally-insulated frame arranged on a surface of the susceptor for holding the thermocouple.

4. An apparatus as claimed in claim 1, further comprising:
   an indentation formed on a side of the susceptor which faces the wafer wherein the first and second sensor elements are arranged in the indentation, and the susceptor is connected to the wafer holder.

5. An apparatus as claimed in claim 1, further comprising:
   a first heating device for heating the substrate wafer;
   a second heating device for heating the susceptor, wherein the second heating device may be independently driven from the first heating device; and
   a control unit for controlling the first heating device as a function of the temperature difference measured by the temperature sensor.

6. An apparatus as claimed in claim 1, further comprising:
   a cooling device which is thermally connected to the wafer holder; and
   a control unit for controlling the cooling device.

7. An apparatus as claimed in claim 1, further comprising:
   a plurality of temperature sensors, each temperature sensor having first and second sensor elements wherein each first sensor element is arranged at a different site on the susceptor and each second sensor element is arranged at a different location between the susceptor and the substrate wafer.

8. A method for measuring the temperature of a substrate wafer in an apparatus for processing the substrate wafer, comprising the steps of:
   providing a reaction chamber;
   providing a wafer holder in the reaction chamber for holding a substrate wafer;

providing a susceptor in the reaction chamber;

providing a temperature sensor having first and second sensor elements, the first sensor element arranged on the susceptor and the second sensor element arranged at a location between the susceptor and the substrate wafer;

measuring a first temperature at the susceptor;

measuring a second temperature at the location between the susceptor and the substrate wafer;

determining a temperature difference between the first temperature and the second temperature; and determining a substrate wafer temperature based upon the first temperature, the temperature difference and a predetermined calibration curve.

9. A method as claimed in claim 8, further comprising the steps of:

providing a first heating device for heating the substrate wafer;

providing a second heating device for heating the susceptor;

providing a control unit for controlling the first heating device as a function of the temperature difference measured by the temperature sensor; and controlling the first heating device so that the temperature difference is substantially zero.

10. A method as claimed in claim 8, further comprising the steps of:

providing a cooling device which is thermally connected to the wafer holder;

providing a control unit for controlling the cooling device; and controlling the cooling device as a function of the temperature of the substrate wafer.

\* \* \* \* \*